(12) United States Patent
Mitchell et al.

(10) Patent No.: US 6,690,986 B1
(45) Date of Patent: Feb. 10, 2004

(54) METHOD OF DETECTING THE POSITION OF A WAFER

(75) Inventors: Robert John Clifford Mitchell, West Sussex (GB); Ian R. Joyce, West Sussex (GB); James Biddle, West Sussex (GB); James Victor Edwards, West Sussex (GB)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/552,696

(22) Filed: Apr. 19, 2000

(30) Foreign Application Priority Data

Apr. 19, 1999 (GB) ................................. 9908951

(51) Int. Cl.$^7$ ............................................. G06F 19/00
(52) U.S. Cl. ..................... 700/112; 700/59; 414/217; 414/941
(58) Field of Search ............................. 700/112, 121, 700/114, 59–62, 218, 258, 259; 414/217, 935, 936, 939, 941; 356/399, 615, 401, 621, 622; 250/559.33, 559.29

(56) References Cited

U.S. PATENT DOCUMENTS

| | | | |
|---|---|---|---|
| 4,819,167 A | * | 4/1989 | Cheng et al. .................. 700/59 |
| 5,258,823 A | | 11/1993 | Akamatsu .................... 356/375 |
| 5,563,798 A | * | 10/1996 | Berken et al. ............... 700/218 |
| 5,706,930 A | | 1/1998 | Sahoda et al. ............ 198/464.2 |
| 5,780,849 A | | 7/1998 | Kikuchi .................. 250/231.13 |
| 5,783,834 A | * | 7/1998 | Shatas .................... 250/559.33 |
| 6,362,883 B1 | * | 3/2002 | Watkins ....................... 356/399 |

FOREIGN PATENT DOCUMENTS

EP 0063289 A2 1/1982

* cited by examiner

*Primary Examiner*—Leo Picard
*Assistant Examiner*—Steven R. Garland
(74) *Attorney, Agent, or Firm*—Boult Wade Tennant

(57) ABSTRACT

An apparatus for processing wafers one at a time. The apparatus has a vacuum chamber into which wafers are loaded through a pair of loadlocks which are spaced one above the other. A robot within the vacuum chamber has a pair of gripper arms which are moveable along and rotatable about a vertical axis so as to be moveable between the loadlocks and a wafer processing position. Each of the loadlocks has a vertically moveable portion which is moveable away from the remainder of the loadlock to provide access in a horizontal plane for one of the gripper arms. Signals from encoders and optical sensors are used to determine that a handoff position has been reached.

11 Claims, 7 Drawing Sheets

FIG. 5. THROUGHPUT GRAPH FOR 1 SCANNER, 85 IMPLANT AND 75 MOVE TO LOAD/IMPLANT, 65 EXCHANGE, 14.5 CYCLE, 257 wph.

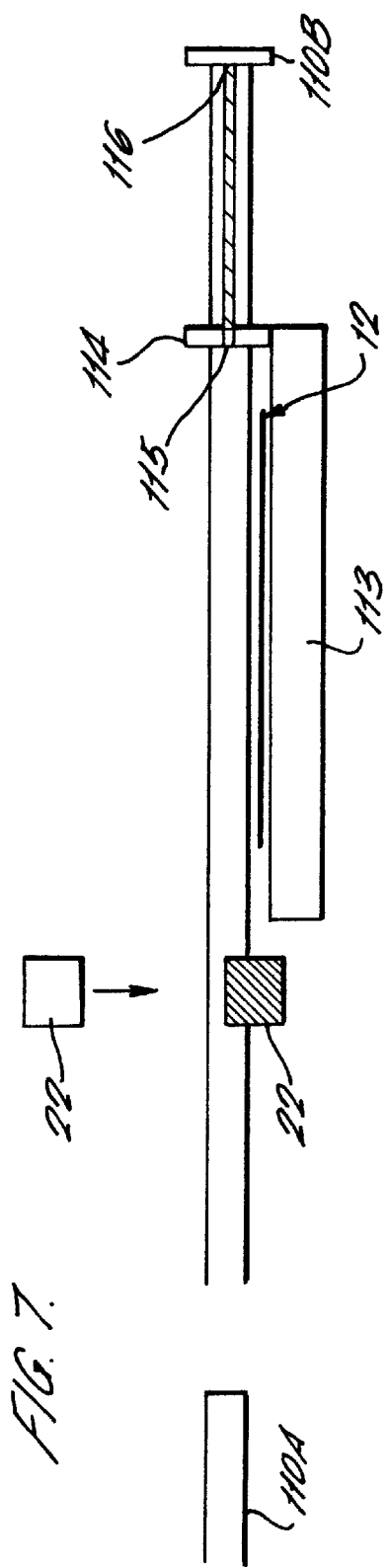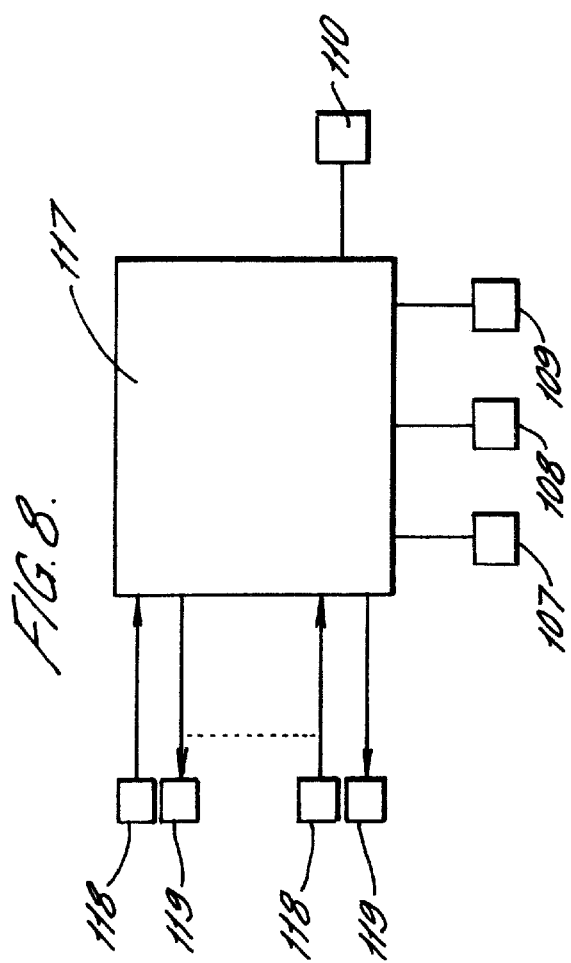

METHOD OF DETECTING THE POSITION OF A WAFER

BACKGROUND OF THE INVENTION

Field of the Invention

The present invention relates to a method of detecting the position of a wafer.

In an ion implantation apparatus such as that disclosed in EP 604066 wafers are loaded one by one from atmospheric conditions into a vacuum chamber through a loadlock chamber. The loadlock chamber is essentially a chamber between a vacuum chamber and the atmosphere which has an outer valve which is selectively operable to seal the loadlock chamber from the atmosphere and an inner valve which is selectively operable to seal the loadlock chamber from the vacuum chamber.

With the outer valve open and the inner valve closed, a wafer is loaded from a supply of untreated wafers into the loadlock chamber by an atmospheric robot. The outer valve is then closed and the loadlock chamber is evacuated. The inner valve is then opened and the wafer is picked up by a vacuum robot and transported to a processing position. Similarly, to transport a processed wafer out of the vacuum chamber, the outer valve is closed and the inner valve is opened allowing the vacuum robot to replace the treated wafer in the loadlock chamber. The inner valve is then closed and the chamber is vented to atmospheric pressure allowing the outer valve to be opened and the processed wafer to be retrieved by the atmospheric robot.

The handoff process between the two robots and the loadlock is done several times a minute, and must be done with great accuracy to avoid sliding the wafer across the loadlock platen which causes particulate contamination on the back of the wafer. The robots used have a tendency to drift over time, particularly as components wear out making accurate repeatable performance over time difficult to achieve. Also, because the encoders in the robots do not provide absolute position readings, they must be taught the handoff position. This calibration can be time consuming and inaccurate when done manually.

SUMMARY OF THE INVENTION

According to the present invention a method of detecting the position of a wafer of a known diameter comprises the steps of emitting light from a first source to a first sensor; emitting light from a second source to a second sensor; introducing a wafer such that it intercepts some of the light from the first source directed to the first sensor and the second source directed to the second sensor; and measuring the intensity of light incident on the two sensors.

The method relies on simple optical sensors which provide an analogue signal, and the position of the wafer can be calculated based upon simple geometry using only the outputs from the two sensors and the diameter of the wafer. The absolute position of the wafer can therefore be determined precisely and with a high degree of repeatability.

The invention also extends to a loadlock for the transportation of semi-conductor wafers from the atmosphere into a vacuum chamber, the loadlock comprising a wafer support position in which a wafer is to be supported, a first light source emitting light towards a first light sensor and a second light source emitting light towards a second sensor, the first and second light sources being positioned such that some of the light emitted by both sources towards their respective sensors is intercepted by a wafer in the wafer support position. The position sensing is done independently from a mechanism for moving the wafer.

This apparatus is capable of carrying out the method as defined above.

The light sources can be any source which produces a collimated beam of light, such as an LED. However, the preferred light source is a class 1 modulated infra-red laser. Such a light source is safe enough that it can be used without any shielding. Further, the sensor can sense the light at the frequency of modulation and is thus able to distinguish light from the light source from ambient light. The sensors can be position sensitive diodes. However, simple photodiodes which produce a signal in proportion to the intensity of light incident on them are preferred as they are cheaper.

As the sensing is done optically, the light sources and sensors can be positioned outside of the loadlock chamber behind appropriately positioned windows. This allows the sensing to be done simply and cheaply and allows for easy maintenance without requiring access to the loadlock.

The method of the present invention can also be used in a method of calibrating and operating an apparatus for processing wafers, the apparatus having a gripper on which a wafer is transported, the gripper being driven by one or more servo motors with position encoders, the method comprising the steps of emitting light from a third source to a third sensor; moving the gripper to a predetermined handoff position at which it intercepts a predetermined proportion of the light directed to the third sensor; measuring the intensity of the light reaching the third sensor and reading from the encoder for the or each servo motor; detecting the position of a wafer on the gripper using the method according to the present invention as described above; and for subsequent wafers driving the or each servo motor to the positioned determined by its encoder, and measuring the intensity of the light at the three sensors to verify that the wafer and gripper are correctly positioned.

This method allows the gripper to be taught the hand-off position very simply as the teaching can be done in the software. Furthermore, this method allows for drift monitoring of the operation of the gripper.

In order to determine the location of the wafer in the direction perpendicular to the plane of the wafer, a further light source may be provided which emits light towards a further sensor in a direction perpendicular to a direction in which the light is emitted from the first and second light sources. In this case, the method further comprises raising or lowering the wafer such that the wafer or gripper on which the wafer is supported intercepts some of the light from the further source directed to the further sensor; and measuring the intensity of the light incident on the fourth detector. This provides a way of determining the elevational position of the wafer.

The further light source and sensor can also be used in the type of loadlock which requires elevational movement of a loadlock platen on which the wafer is supported in order to open the loadlock chamber and provide access to the loadlock chamber for the gripper arm. In this case, the method further comprises raising the loadlock platen to a position at which part of the light from the further light source to the further sensor is intercepted by part of the platen. As both the gripper and the loadlock platen are located using the same optical sensor, they can be located very precisely relatively to one another.

This forms a further aspect of the present invention which, in the broadest sense, can be defined as an apparatus detecting that two members are correctly positioned relatively to one another at a predetermined position, the apparatus comprising a light source, a light sensor onto which light from the light source is projected, and a respective flag provided on each member which produces a characteristic shadow on the light detector when in the predetermined position, the characteristic shadow of the two member being different from one another.

Preferably the apparatus further comprises a loadlock chamber relatively to which the light source and light sensor are fixed and the two members are a loadlock platen and a gripper arm which takes wafers to and from the loadlock platen. The flag on one of the loadlock platen and gripper arm is preferably a through hole and the flag on the other of the loadlock platen and gripper arm is preferably a part of the loadlock platen or gripper arm as the case may be arranged to intercept a predetermined proportion of the light projected through the through hole when the gripper arm and loadlock platen are in the predetermined position.

The present invention further encompasses an apparatus for calibrating and controlling an ion implantation apparatus, the ion implantation apparatus having a gripper on which a wafer is transported, the gripper being driven by one or more servo motors, the apparatus for calibrating and controlling comprising a computer, an encoder on each servo motor for producing a signal relating to the position of the servo motor and providing this information to the computer, a connection between the computer and the drive mechanism of each servo motor for controlling the motion of each servo motor, and three sensors for receiving light respectively from three light sources; the computer having a processor arranged to receive and store values indicative of signals from the encoders and sensors recorded when the gripper is at a predetermined handoff position at which the gripper and wafer intercept a predetermined proportion of the light directed to the three sensors, to subsequently output a signal to the servo motors to drive the servo motors to a position at which the reading from each encoder matches the stored value, and to record the signal from each of the three sensors in this position and compare these values with the stored values.

Preferably the processor is further arranged to determine the drift of the gripper by comparing the stored value of each sensor reading with each measured value. Preferably the processor is further arranged to alert an operator if the amount of drift detected exceeds a predetermined threshold.

BRIEF DESCRIPTION OF THE DRAWINGS

A method and apparatus constructed in accordance with the present invention will now be described with reference to the accompanying drawings, in which:

FIG. 7 is a schematic vertical section showing the elevational location of the wafer; and FIG. 8 is a schematic diagram of the control system of the present invention.

DESCRIPTION OF THE INVENTION

The ion implantation apparatus is broadly the same as that disclosed in WO99/13488.

The apparatus comprises a vacuum chamber into which wafers are loaded independently onto an electrostatic chuck (hereafter referred to as an e-chuck). In operation an individual wafer is electrostatically clamped on the e-chuck and is held vertically and is scanned by a horizontally scanning ion beam.

The arm which supports the e-chuck extends out of the vacuum chamber and is supported by a linear motion mechanism for reciprocably moving the e-chuck vertically so that the entire surface of a wafer on the e-chuck is scanned by the ion beam. The linear motion mechanism itself is mounted so as to be rotatable about a horizontal tilt axis which allows the angle between the wafer and the ion beam to be varied. The e-chuck is further provided with a mechanism for rotating the wafer about an axis passing through a centre of the wafer and perpendicular to the plane of the wafer. The mechanism thus far described is as that shown in WO99/13488. Further, the arm itself is independently rotatable about the horizontal tilt axis through 90° so that it can be moved from the vertical scanning position to a horizontal loading position.

An example of an ion implantation apparatus to which the present invention can be applied will now be described with reference to FIGS. 1 to 5.

Figure 1:
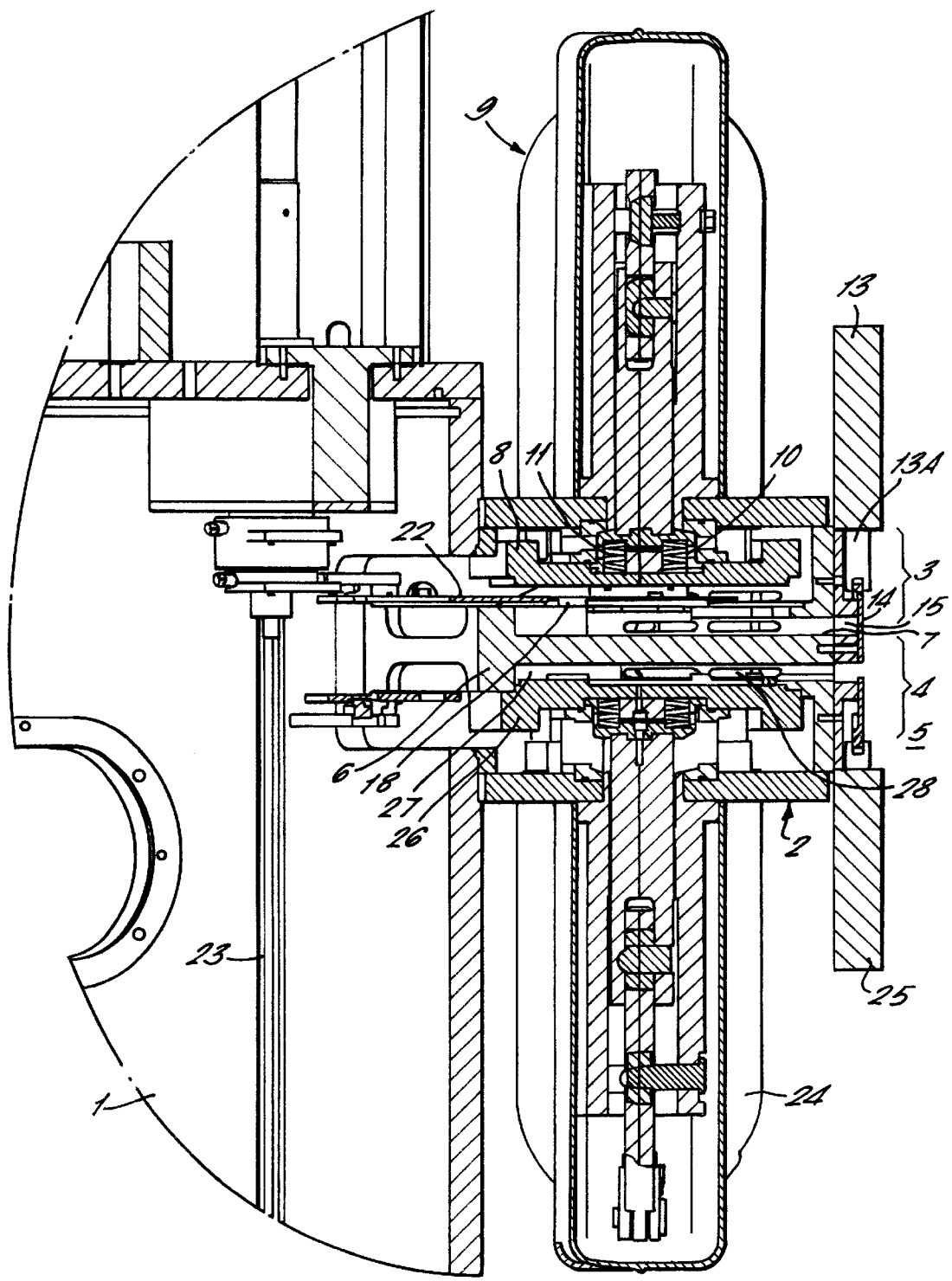
FIG. 1 is a schematic cross-section from one side through the two loadlock chambers and a portion of the vacuum chamber.
Figure 2:
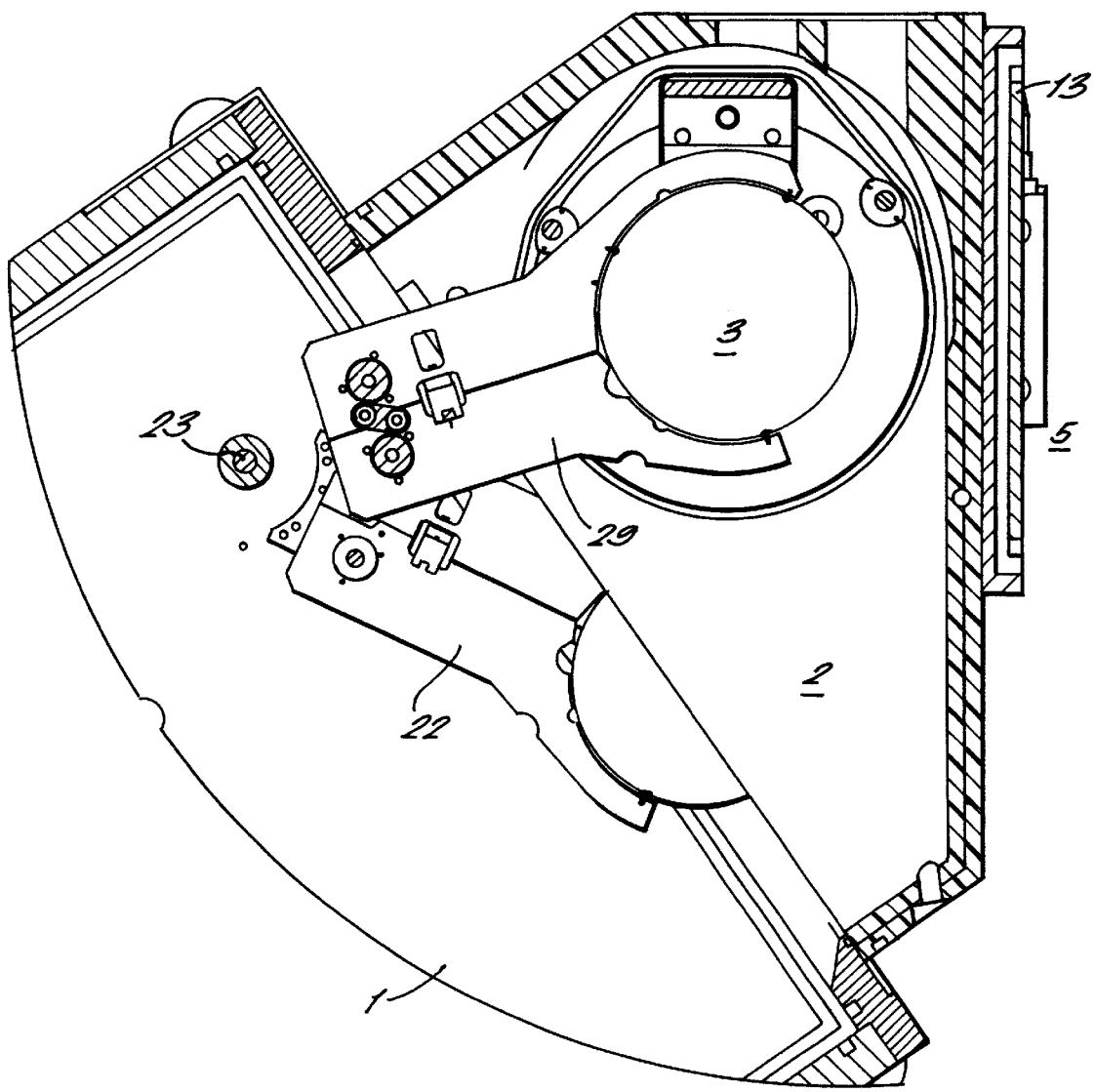
FIG. 2 is a schematic plan view of the arrangement shown in FIG. 1.

The arrangement for loading the wafers into the vacuum chamber is shown in FIGS. 1 and 2. The apparatus broadly comprises the vacuum chamber 1 containing the e-chuck (not shown), a loadlock assembly 2 comprising an upper loadlock 3 and a lower loadlock 4, and an external atmospheric portion 5. The upper loadlock 3 is directly above the lower loadlock 4 in the sense that the wafers retained in the two loadlocks have their centres on the same vertical axis.

In the external atmospheric portion 5 are a number of magazines which provide a source of a wafers to be treated in the ion implantation apparatus, and receive the treated wafers from the ion implantation apparatus.

The loadlock assembly 2 comprises a loadlock housing 6 which has a central plate 7 separating the upper 3 and lower 4 loadlocks. The upper 3 and lower 4 loadlocks are positioned as close together as possible in the vertical direction to minimise the movement required to load and unload wafers from both loadlocks. The upper loadlock 3 is provided with a lid valve 8 which is elevationally movable by a cam mechanism 9 mounted directly above the upper loadlock 3. A bellows 10 provides a vacuum seal for the cam actuator 9, and a spring 11 provides a degree of preloading for the lid valve 8, and absorbs any dimensional tolerances between the lid valve 8 and the housing 6. To provide access for a wafer 12 into the vacuum chamber, the lid valve 8 is raised to the position shown in FIG. 1 allowing lateral access to the wafer on the depending feet for a gripper arm as described below. In FIG. 1 the upper loadlock 3 is shown open to the vacuum chamber 1 with the wafer being in the process of being removed into the vacuum chamber. Access to the atmospheric side of the loadlock is provided by a slit valve 13 in which the gate element 14 can be raised and lowered on an activator 13A in order to seal across a slit 15 through which the wafer can enter the upper loadlock 3.

The mechanism for loading and unloading a wafer 12 from the upper loadlock 3 is shown in more detail in FIG.

3. It should be understood that this figure is schematic, in the sense that it shows both the valve to the vacuum chamber 1 and the valve to the atmosphere 5 open and the mechanisms for transferring the wafer from either side being deployed into the loadlock. Of course, in practice, only one valve will be open at any one time, and only one of the deployment mechanisms will be in place.

An end effector 16 of an atmospheric robot is shown projecting through the slit 15. Within the loadlock, the end effector is represented by a pair of parallel fingers 17, but in practice will project beneath the wafer 12 shown in outline only in FIG. 3, so as to support the wafer. A loadlock carrier 18 is provided to support the wafer in the loadlock. The loadlock carrier 18 has an outer profile which substantially matches the circular profile of the wafer. The opposite side of the loadlock carrier 18 has straight sided recess 19 which is shaped so as to allow the end effector 16, 17 to pass through the loadlock carrier from above as will be described. The loadlock carrier 18 has an upwardly projecting flange which leads up to a bracket 20 with which it is integral. This bracket 20 is rigidly fixed to the lid valve 8, so that the whole loadlock carrier 18 moves up and down with the lid valve 8. Three feet 21 are provided on the upper surface of the loadlock carrier so as to receive the wafer. When the lid valve 8 is raised, the loadlock 3 can be accessed by a gripper arm 22 moving in a horizontal plane about a vertical axis 23.

Figure 3:
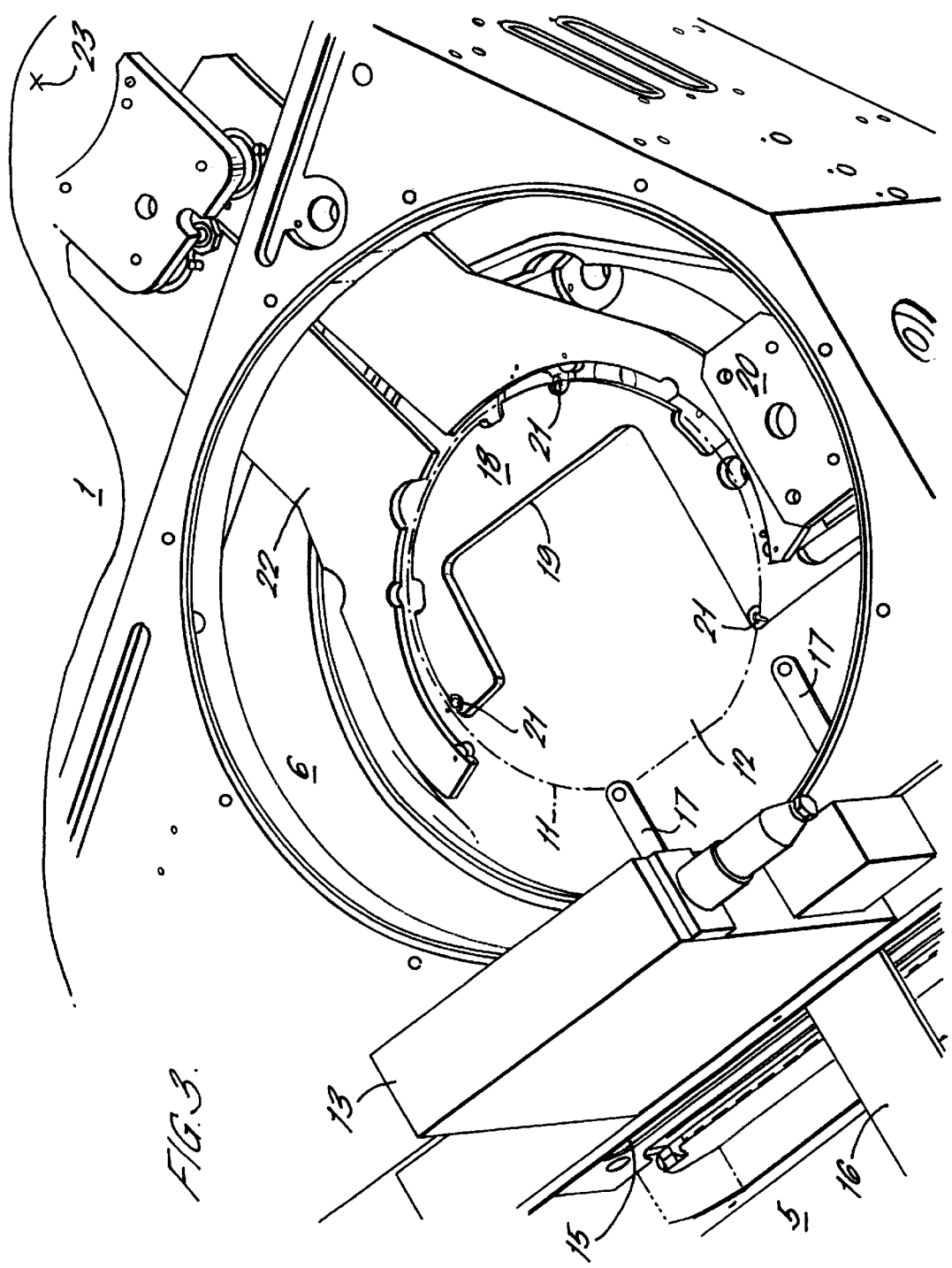
FIG. 3 is a perspective view of the upper loadlock with the lid valve removed.

In order to place a wafer 12 on the loadlock carrier 18, the end effector 17 carrying a wafer 12 is moved through the slit 15 as shown in FIG. 3. The end effector is then moved downwardly through the recess 19 in the loadlock carrier 18 until the wafer is supported by the three feet 21. The end effector is then moved further downwardly so as to be clear of the wafer 12 and is then withdrawn through the slit 15. All of this is done with the lid valve 8 in its lowered or closed position. Once the loadlock chamber has been evacuated, the lid valve 8 is raised, bringing the loadlock carrier 18 and wafer 12 with it. The gripper arm 22 is then swung into the position shown in FIG. 3, and is then moved downwardly, or the loadlock carrier 18 is moved upwardly so that it can grip the edge of the wafer 12 and withdraw it from the loadlock.

The lower loadlock 4 has a similar design to the upper loadlock, in that the cam mechanism 24 and slit valve 25 are of the same construction, but in an inverted configuration. In the lower loadlock, there is no need to provide a the loadlock carrier to support the wafer, as the wafer can be directly supported by feet on the upper surface of lower lid valve 26. The lower lid valve will need a recess of similar shape to the recess 19 between the feet to allow the end effect to place the wafer on the feet and be withdrawn.

In FIG. 1 the loadlock is shown in its raised/closed position in which the lower lid valve 26 seals around its periphery with the housing 6 thereby providing a seal between the lower loadlock 4 and the vacuum chamber 1 and defining a sealed loadlock chamber 27 between the lower surface of plate 7 of the housing 6 and the upper surface of lower lid valve 26. The volume of the loadlock chambers of the upper 3 and lower 4 loadlocks is kept to a minimum to minimise the pumping and venting required.

In the configuration of FIG. 1 and with slit valve 25 open, a wafer can be loaded into the loadlock chamber 27 and is supported by the feet on the lower lid valve. The slit valve 25 is then closed and the loadlock chamber 27 is evacuated through evacuation port 28. The lower lid valve 26 can then be lowered breaking the seal on the vacuum chamber side and providing access to the loadlock chamber 27 from the vacuum chamber 1.

The robot mechanism for transferring the wafers from the loadlock mechanism 2 to the e-chuck will now be described in more detail. In addition to the gripper arm 22 shown in FIG. 3, which will subsequently be referred to as the lower gripper arm, the robot further comprises upper gripper arm 29 of the same construction. The two arms are mounted adjacent to one another so as to be movable together along a vertical axis 23 and rotatable independently about the vertical axis 23.

Figure 4:
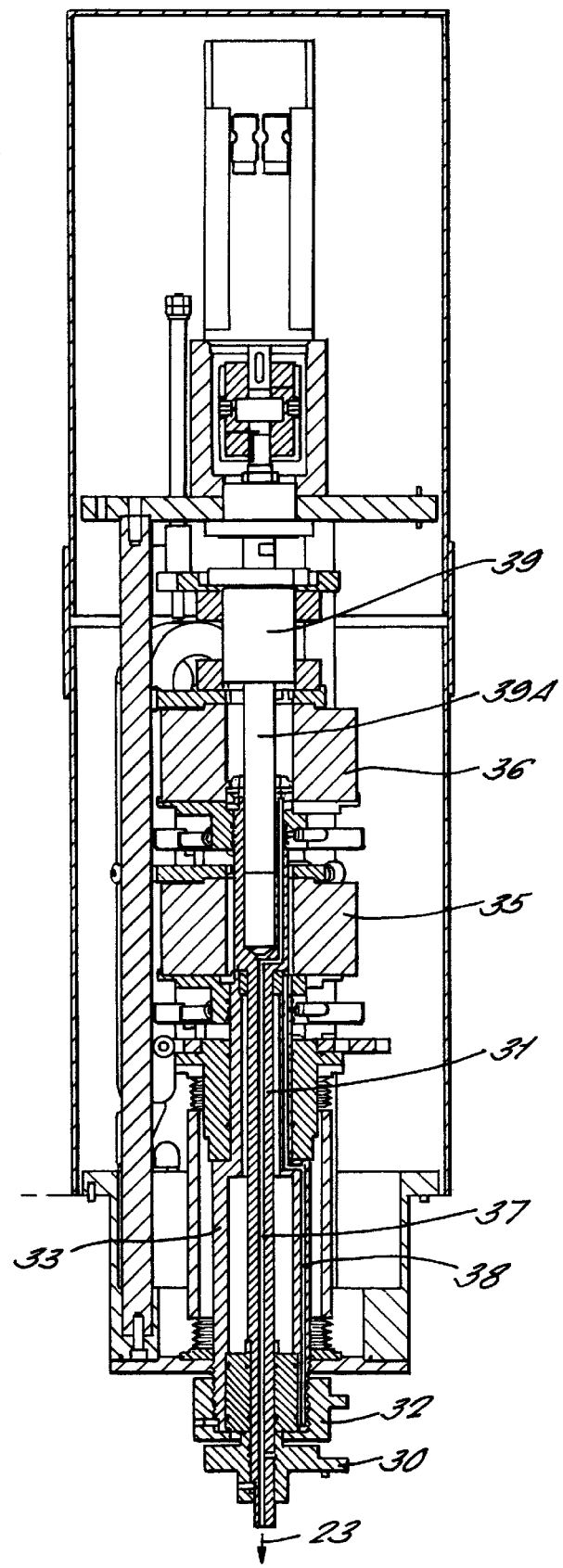
FIG. 4 is a cross-section of the drive mechanism for the two gripper arms in the vacuum chamber.

The mechanism for operating the gripper arms is shown in FIG. 4. The lower gripper arm 22 is attached via hub 30 to an inner shaft 31. The upper gripper arm 29 is attached via hub 32 to an outer shaft 33. The inner shaft 31 is rotated by a motor 35, while the outer shaft 33 is rotated by motor 36. Vacuum seals for the two shafts are provided by ferro-fluidic seals. Air ducts 37, 38 allow the transmission of air to the gripper arms for the pneumatic opening and closing operations of these arms. A third motor 39 rotates a feed screw shaft 39A to provide the axial movement of the two gripper arms 22, 29 together along the axis 23.

The purpose having the pair of gripper arms 22, 29 is that when one is unloading a wafer at a particular location, the other can immediately load a wafer at that location without having to wait for the first one to return with a further wafer for loading. The e-chuck may be at the same elevational height as one of the loadlocks 3, 4, such that elevational movement of the gripper arms 22, 29 is only required when moving wafers between the e-chuck and the loadlock which is elevationally offset from the e-chuck. On the other hand, the e-chuck may be elevationally between the two loadlocks, requiring a smaller elevational movement of the gripper arms each time a wafer is transferred.

The entire loading/unloading operation of this apparatus will now be described with particular reference to FIG. 5. The key to this figure is that five components, namely e-chuck (c), top arm, lower arm, top loadlock (LU), lower loadlock (LL) and the robot for loading wafers from the atmospheric side into the two loadlocks are listed in the left hand column. The operation of each of these components at any one time is listed in the shaded boxes immediately to the right of each listed component. The letters included in these boxes refer to the location to which the component has travelled at any particular time. For example, the box containing (c) in the line indicating the position of the lower arm means that, at this time, the lower arm is at the e-chuck. The letter (M) in the line for the robot refers to a magazine on the atmospheric side supplying wafers to the implant apparatus, and the letters (or) in the line for the robot refer to an ion orientation apparatus for correctly orientating the wafer before it is placed in the loadlock mechanism 2.

The operation of the apparatus can most clearly be described by referring to the passage of a single wafer (hereafter referred to as the wafer in question) through the apparatus from the time that an untreated wafer leaves the magazine (M) to the time that the treated wafer is returned to the magazine (M). It should be understood that, every time the wafer is deposited at a particular location, the wafer which is one step ahead of the wafer in question will just have been removed from this location. Also each time the wafer is picked up from a particular location, it will be replaced by a later wafer which is one stage behind in the process.

Figure 5:
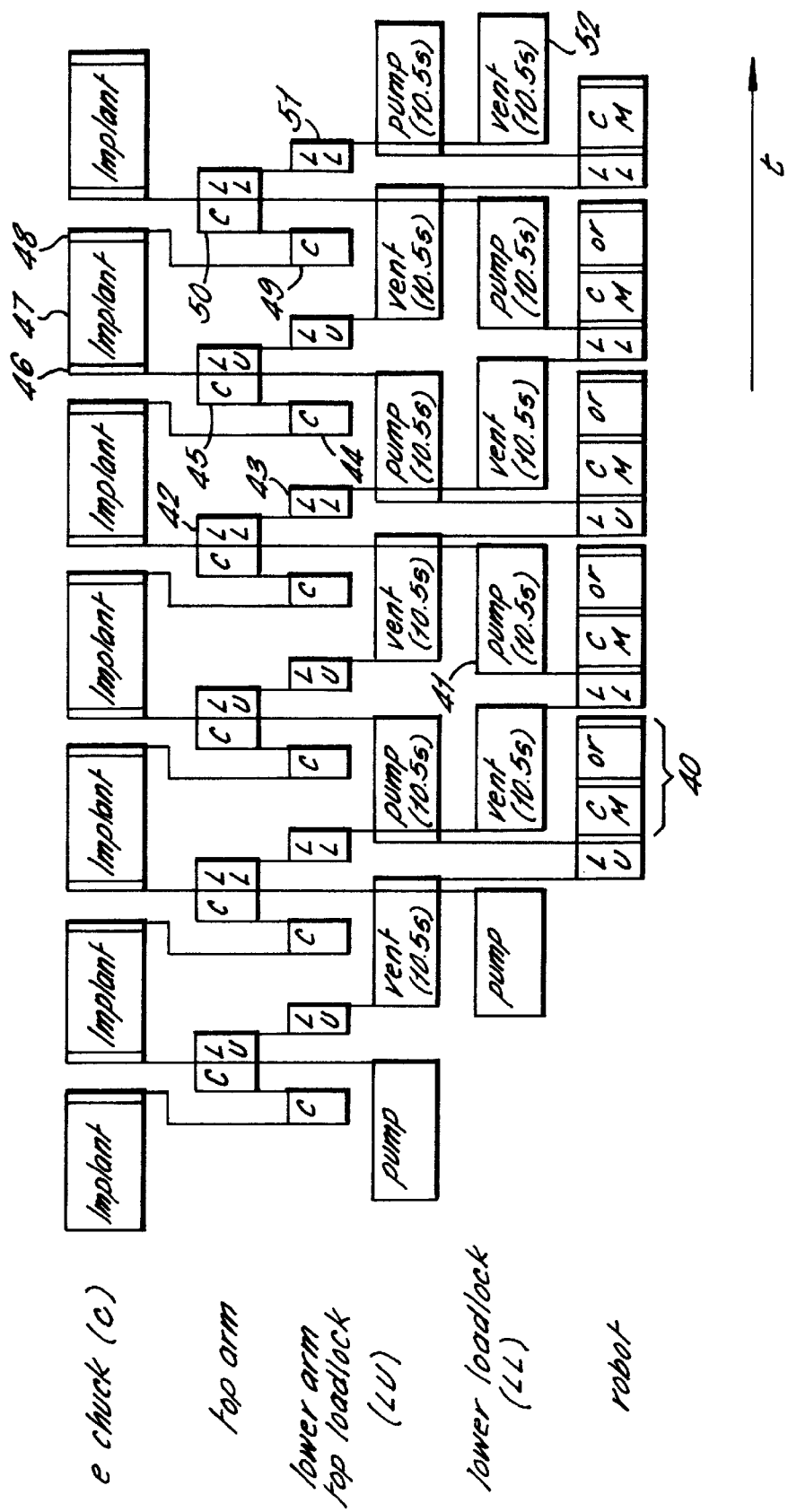
FIG. 5 is a throughput graph showing the movements of the various components of the apparatus.

The wafer in question is picked up by the atmospheric robot from the magazine (M) and transferred to the orientation mechanism (or) where it is rotated to the correct orientation as shown at 40 in FIG. 5. On its next pass, the atmospheric robot picks the wafer in question out of the orientation mechanism (or) and transfers it to the lower loadlock 4. At this time, the apparatus has the lower slit valve 25 open and the lower lid valve 26 raised. Once the wafer in question is in place, the slit valve 25 is closed and the loadlock chamber 27 is evacuated as shown at 41 in FIG. 5. It will be understood that the atmospheric robot loads the upper 3 and lower 4 loadlocks alternately as shown on the bottom line of FIG. 5.

Once the loadlock chamber 27 is evacuated, the lower lid valve 26 is lowered by the cam mechanism 24. The wafer in question is now in a position in which it can be gripped by upper gripper arm 29 as indicated at 42 in FIG. 5. As mentioned above, it will be understood that the lower arm 22 then moves a treated wafer in the opposite direction into the lower loadlock 4 as indicated at 43 in FIG. 5. The upper gripper arm 29 with the wafer in question then rotates about axis 23 towards the e-chuck and waits. While this is happening, the lower gripper arm 22 which is now not carrying a wafer moves to the e-chuck and picks up the wafer which has just been scanned as indicated at 44 and FIG. 5. The wafer in question is then put onto the e-chuck as indicated at 45 in FIG. 5. The e-chuck is then electrostatically activated to attract the wafer in question to the chuck, and is rotated from its horizontal loading configuration to a vertical scanning configuration which takes approximately one second and is illustrated at 46 in FIG. 5. The wafer in question is then scanned with the ion beam as previously described and as indicated in 47 in FIG. 5. Once this operation is complete, the e-chuck returns to the horizontal loading configuration as indicated by 48 in FIG. 5, whereupon the lower gripper arm 22 retrieves the wafer in question as illustrated at 49 in FIG. 5. The upper gripper arm 29 loads the next wafer to be treated onto the e-chuck as indicated at 50 in FIG. 5. The lower arm then rotates about axis 23 and transports the wafer in question to the lower loadlock 4 as indicated at 51 in FIG. 5. At this time, the lower lid valve 26 is in its lowered position and the slit valve 25 is closed. Once the wafer in question is in place, the lower lid valve 26 is raised and the loadlock chamber 27 is vented back to atmospheric pressure as indicated at 52 in FIG. 5 through port 28, or a separate port. Once the chamber has been vented, the slit valve 25 opens and the wafer is collected by the atmospheric robot and returned to the magazine containing completed wafers.

As is apparent from FIG. 5, while one of the loadlocks 3, 4 is being pumped to vacuum, the other is being vented to atmosphere almost simultaneously, but slightly later. This means that while the treated wafer is being transported out of the vacuum chamber through one loadlock, an untreated wafer is being transported in through the other. This allows a regular supply of wafers to the e-chuck, thereby reducing the gap between implant operations.

With this apparatus it will be possible to process up to 270 wafers per hour, as opposed to about 200 per hour in the prior art.

The apparatus described above forms the subject of our [co-pending U.S. application (agents ref. 51004/000) filed on the same date as the present application] U.S. Pat. No. 6,350,097 to Mitchell et al.

The present invention is intended for use with the above described apparatus and is described in detail below with reference to FIGS. 6 and 7.

Figure 6:
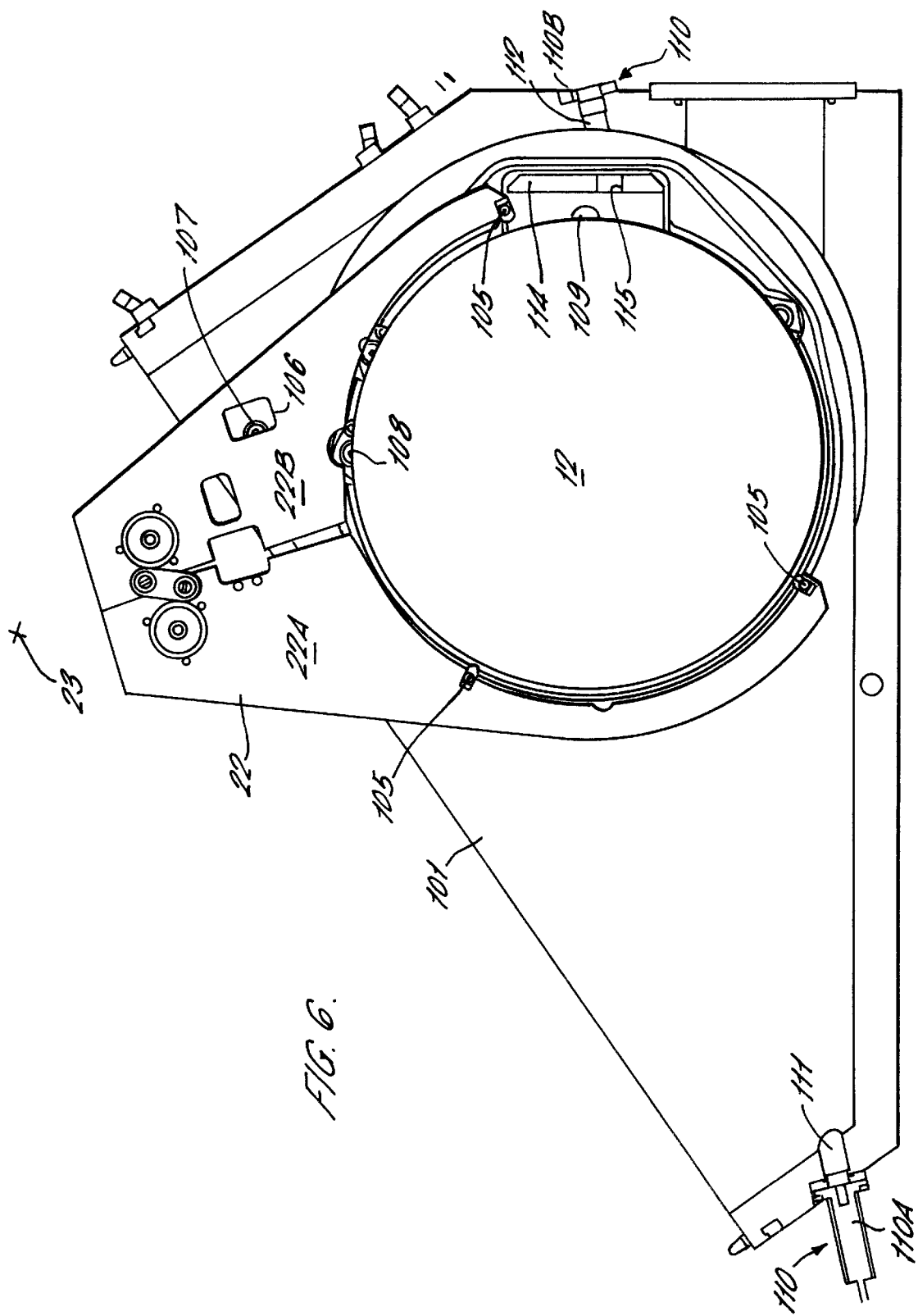
FIG. 6 is a plan view of a gripper arm, wafer and loadlock.

FIG. 6 shows a loadlock chamber 101 containing a wafer 12. The wafer is picked up from the loadlock chamber 101 (at the position shown in FIG. 6) and taken to a processing position (not shown) by a robot driven gripper arm 22 which is also responsible for returning the wafer to the loadlock chamber 101. The gripper arm 22 is rotatable about a vertical axis 23 between the loadlock and the processing position. The gripper arm 22 is also linearly elevationally moveable along the axis 23.

In practice, a second gripper arm is also provided which can either be disposed on the opposite side of axis 23 to the gripper arm 22 and rotatable together with the gripper arm 22 or may be as the upper gripper arm 29 as described above.

The gripper arm 22 comprises a pair of jaws 22A, 22B which are pneumatically moveable towards and away from one another in a conventional manner in order to grip and release the wafer 12. The wafer 12 is gripped by three gripping fingers 105 which engage with the edge of the wafer 12. In FIG. 6 the gripper arm 22 is shown in an open position with the gripping fingers 24 away from the edge of the wafer 12. The gripper arm 22 has a vertical through hole 106 for reasons to be described later.

The loadlock 101 is provide with first 107 second 108 third 109 and fourth 110 optical position detectors.

Only the fourth detector 110 is shown in detail in the drawings but it will be understood that the first to third sensors 107 to 109 are of a similar construction to the fourth detector 110.

The fourth sensor 110 comprises a light source 110A which is arranged to shine a spot of collimated light across the loadlock 101. In the present example, the light source is a laser which produces a modulated infra-red beam with a 10 mm spot size. The beam is projected towards a sensor 110B which in this case is a position sensitive diode for reasons to be described, but for all of the first to third sensors 107 to 109 can be a simple photovoltaic detector which produces an output signal proportional to the intensity of the light on the sensor. As can be seen in FIG. 6, the light source 110A is mounted in the wall of the loadlock chamber 101 behind a window 111, and the sensor 110B is similarly mounted behind a window 112. In order to remove either the light source 110A or the sensor 110B, it is simply a matter of removing the fittings holding the light source or sensor in place and taking it out for maintenance or replacement without requiring entry into the loadlock chamber 101.

The first to third sensors 107 to 109 are constructed and mounted in a similar manner, but each light source for these sensors is mounted so as to project a beam vertically (i.e. out of the plane of the page in FIG. 6) towards a sensor on the opposite face of the loadlock chamber 101.

The first detector 107 is positioned so as to detect the edge of the vertical through hole 106 in the gripper arm 22. As the position of the gripper arm 22 is known from encoders provided on the servo motors which drive the gripper arm 22, the detector arm 107 will not confuse the edge of the gripper arm 22 for the edge of the through hole 106. Instead of detecting the edge of through hole 106, the first detector 107 could detect the edge of the gripper arm. However, in the present example, there is insufficient space to do this. It will be understood that through hole 106 could be replaced with a corresponding notch in the side of the gripper arm. The gripper arm 22 is driven to the position shown in FIG. 6, whereupon the sensor for the first detector will produce a photovoltaic signal which is 50% of the signal produced by an uninterrupted beam. This sensor is therefore used to determine accurately that the gripper arm 22 is in the handoff position.

Second 108 and third 109 sensors are provided to detect the edge of the wafer 12. The two sensors are spaced at 90° around the circumference of the wafer 12. With the wafer 12 in place, both sensors 108, 109 will produce a signal proportional to the distance that the edge of the wafer has travelled across the sensor. With these two readings, and knowing the diameter of the wafer 102, the exact position of the centre of the wafer, and hence the wafer itself, can be determined.

The fourth detector 110 provides an indication of the vertical position not only of the gripper arm 22, but also of a loadlock platen 113 on which the wafer is supported. The loadlock platen 113 is vertically moveable so as to allow the wafer 12 to be moved to a vertical position at which it can be picked up by the gripper arm 22. The loadlock platen 113 is provided with a flag 114 which is essentially an upwardly projecting flange with a through hole 115. The flag is arranged so that, when it is at the correct height, it produces a spot 116 on the fourth sensor 110B thereby determining that the loadlock platen is at the correct elevational position. By using a position sensitive diode for the fourth sensor 110B, the apparatus can easily be calibrated so that a unique signal is produced when the loadlock platen is in the correct position. Simple photodiodes could also be used, but more care would be needed in the measurement of the correct position, as more than one position of the platen could produce the same reading.

Following the location of the platen 113, the gripper arm 22 is moved downwardly from the position shown in outline in FIG. 7 to the position shown shaded in FIG. 7 at which it intercepts half of the light producing the spot 116. This allows the elevational position of the gripper arm 22 to be accurately referenced with respect to the loadlock platen 113.

The apparatus as described is calibrated as follows with reference to FIGS. 6 to 8. With the wafer 12 held in the gripper arm 22, the gripper arm 22 is driven to the position shown in FIG. 6 until the reading at detector 107 drops to 50% of the fully illuminated reading as determined by computer 117 which receives signals from the four sensors 107–110. At this position, readings are taken from the second to fourth 108 to 110 detectors as well as from an encoder 118 on each servo motor which drives the gripper arm 22. These readings are stored in memory of the computer 117.

For all subsequent operations, the computer provides a signal to the drives 119 of the servo motors to drive the gripper arm 22 to a position in which the encoder signals for the servo motors match those stored which should bring the gripper arm 22 accurately to the position shown in FIG. 6. Each time the gripper arm 22 is driven into the positioned determined by the encoder, readings are taken from the first 107, second 108 and third 109 sensors and these are compared by the computer 117 with the stored readings ensure that the gripper 3 and wafer 12 are correctly positioned. If the measured readings have drifted, the computer determines this and checks whether the amount of drift is within acceptable limits. If not, it produces a warning to an operator. The first sensor 107 allows for any drift in the operation of the gripper 22 to be determined, while the second 108 and third 109 sensors allow for any misalignment of the wafer 12 within the gripper 22 to be determined.

We claim:

1. An apparatus comprising:
   a loadlock chamber,
   a loadlock platen,
   a gripper arm to take wafers to and from the loadlock platen, and
   means for detecting that the loadlock platen and the gripper arm are correctly positioned relatively to one another at a predetermined position, including:
   a light source,
   a light sensor onto which light from the light source is projected, said source and said sensor being fixed relative to said loadlock chamber, and
   a respective flag provided on each of said platen and said gripper which produces a characteristic shadow on the light sensor when in the predetermined position, the characteristic shadows of the flags of the platen and the gripper being different from one another.

2. The apparatus according to claim 1, wherein the light source is a modulated infrared laser.

3. The apparatus according to claim 1, wherein the sensor is a photodiode which produces a signal in proportion to the intensity of the light incident.

4. The apparatus according to claim 1, wherein the light source and sensor are positioned outside of the loadlock chamber behind appropriately positioned windows.

5. The apparatus according to claim 1, wherein a second light source is provided which emits light towards a second sensor in a direction perpendicular to a direction in which the light is emitted from the light sources.

6. The apparatus according to claim 1, wherein the flag on one of the loadlock platen and gripper arm is a through hole and the flag on the other of the loadlock platen and gripper arm is a part of the loadlock platen or gripper arm as the case may be arranged to intercept a predetermined proportion of light projected through the through hole when the gripper arm and loadlock platen are in the predetermined position.

7. An apparatus for calibrating and controlling an ion implantation apparatus, the ion implantation apparatus having a gripper on which a wafer is transported, the gripper being driven by one or more servo motors, the apparatus for calibrating and controlling comprising a computer, an encoder on each servo motor for producing a signal relating to a position of the servo motor and providing this information to the computer, a connection between the computer and each servo motor for controlling the motion of each servo motor, and three sensors for receiving light respectively from three light sources; the computer having a processor arranged to receive and store values indicative of signals from the encoders and sensors recorded when the gripper is at a predetermined handoff position at which the gripper and wafer intercept a predetermined proportion of the light directed to the three sensors, to subsequently output a signal to the servo motors to drive the servo motors to a position at which a reading from each encoder matches the stored value, and to record the signal from each of the three sensors in this position and compare these values with the stored values.

8. The apparatus according to claim 7, wherein the processor is further arranged to determine gripper positioning drift by comparing the stored value of each sensor reading with each measured value.

9. The apparatus according to claim 8, wherein the processor is further arranged to alert an operator if an amount of drift detected exceeds a predetermined threshold.

10. A method of locating a wafer of a known diameter in a loadlock, the method comprising the steps of emitting light from a first source to a first sensor parallel to a direction; emitting light from a second source to a second sensor parallel to said direction; introducing a wafer into the loadlock such that it intercepts some of the light from the first source directed to the first sensor and the second source directed to the second sensor; measuring the intensity of light incident on the two sensors; raising or lowering the wafer such that the wafer or gripper on which the wafer is supported intercepts some of the light from a further light source directed to a further sensor perpendicular to said direction; measuring the intensity of the light incident on said further detector; and raising a loadlock platen to a position at which part of the light from the further light source to the further sensor is intercepted by part of the platen.

11. A method of calibrating and operating an apparatus for processing wafers, the apparatus having a gripper on which a wafer is transported, the gripper being driven by one or more servo motors with position encoders, the method comprising the steps of emitting light from a first source to a first sensor, emitting light from a second source to a second sensor; emitting light from a third source to a third sensor; moving the gripper to a predetermined handoff position at which it intercepts a predetermined proportion of the light directed to the third sensor and a wafer on the gripper intercepts some of the light from the first source directed to the first sensor and the second source directed to the second sensor; measuring the intensity of the light reaching the third sensor and reading from the encoder for the or each servo motor; detecting the position of a wafer on the gripper by measuring the intensity of light incident on the first and second sensors; and for subsequent wafers driving the or each servo motor to the positioned determined by its encoder, and measuring the intensity of the light at the three sensors to verify that the wafer and gripper are correctly positioned.

* * * * *